(12) United States Patent
Shimada et al.

(10) Patent No.: US 7,025,514 B2
(45) Date of Patent: Apr. 11, 2006

(54) DEVELOPMENT APPARATUS FOR MANUFACTURING SEMICONDUCTOR DEVICE

(75) Inventors: Keizo Shimada, Miyazaki (JP); Yasuharu Ohta, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 372 days.

(21) Appl. No.: 10/676,073

(22) Filed: Oct. 2, 2003

(65) Prior Publication Data
US 2004/0106298 A1    Jun. 3, 2004

(30) Foreign Application Priority Data
Oct. 8, 2002    (JP) ............................. 2002-294886

(51) Int. Cl.
*G03D 5/04*    (2006.01)

(52) U.S. Cl. ...................... 396/604; 396/611; 396/627; 430/311; 430/322; 118/52

(58) Field of Classification Search ..................... None
See application file for complete search history.

(56) References Cited

U.S. PATENT DOCUMENTS
6,376,013 B1    4/2002    Rangarajan

FOREIGN PATENT DOCUMENTS
JP    07-176471    7/1995

*Primary Examiner*—D. Rutledge
(74) *Attorney, Agent, or Firm*—Takeuchi & Kubotera, LLP

(57) ABSTRACT

A development apparatus for discharging a developer onto a surface of a semiconductor substrate (15) comprises a nozzle pipe (13) for supplying the developer, and a nozzle (14) having a shape of a spoon with a taper and discharging the developer supplied by the nozzle pipe onto the surface of the substrate. The nozzle sprays the developer onto the surface of the substrate at any spray angle under a low and constant pressure.

5 Claims, 6 Drawing Sheets

DEVELOPMENT APPARATUS FOR MANUFACTURING SEMICONDUCTOR DEVICE

BACKGROUND OF THE INVENTION

1. Field of the Invention

The present invention relates to a development apparatus useful for manufacturing a semiconductor device, especially to a discharge nozzle useful for the development process.

2. Description of the Related Art

FIG. 9 is a schematic diagram of a conventional development apparatus used in manufacturing a semiconductor.

The conventional development apparatus comprises a developer tank 1, an electromagnetic valve 2, a nozzle pipe 3, and a spray nozzle (nozzle tip) 4. The surface of a substrate 5 is coated with a developer sprayed by the spray nozzle 4. The substrate 5 is left for tens of seconds with the coated developer so that a photo-resist film is reacted with the developer to create a pattern.

The coating of the surface of the substrate 5 with the developer by the spray nozzle 4 is performed such that the developer is discharged in a shape of fan in order to coat a large area of the substrate 5 in a short time.

However, according to the above-described conventional method, it is required that the spray angle of the developer discharged by the spray nozzle 4 is so large that the surface of the substrate 5 is coated with the developer in a short time. For this purpose, it is necessary to set high the discharge pressure of the developer. It, however, causes a great impact on the surface of the substrate 5, which results in decrease of the uniformity of the resist pattern.

Although the spray angle and the impact strength are variable with the inner diameter and the discharge pressure of the spray nozzle 4, no spray nozzle has met both requirements for a large spray angle (large sprayed area) and a low discharge pressure (low impact strength).

Also, according to the conventional method, the substrate 5 is rotated during the spray to efficiently apply the developer onto the surface of the substrate 5. However, a considerable amount of the developer is wasted because of the centrifugal force produced by the rotation of the substrate 5.

SUMMARY OF THE INVENTION

Accordingly, it is an object of the present invention to provide a development apparatus capable of efficiently applying a developer onto a large sprayed area of the surface of a stationary substrate under a low discharge pressure.

In order to achieve the above object, according to one aspect of the invention, a development apparatus for discharging a developer onto a surface of a semiconductor substrate comprises a nozzle pipe for supplying the developer, and a nozzle having a shape of a spoon with a taper and discharging the developer supplied by the nozzle pipe onto the surface of the substrate, wherein the nozzle sprays the developer onto the surface of the substrate at any spray angle under a low and constant pressure.

According to another aspect of the invention, a development apparatus for discharging a developer onto a surface of a semiconductor substrate comprises a nozzle pipe for supplying the developer, a nozzle having a shape of a spoon with a taper and discharging the developer supplied by the nozzle pipe onto the surface of the substrate, and a scanning device for simultaneously scanning the nozzle pipe and the nozzle above the substrate in a stationary state, wherein the nozzle sprays the developer onto the surface of the substrate at any spray angle under a low and constant pressure.

According to still another aspect of the invention, the development apparatus further comprises an adjusting device for adjusting a position of the nozzle above the stationary substrate.

DESCRIPTION OF THE PREFERRED EMBODIMENT

Figure 1:
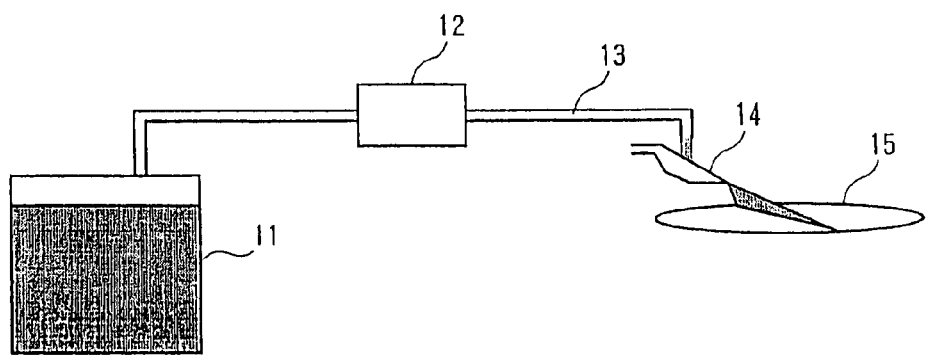
FIG. 1 is a schematic diagram of a development apparatus for manufacturing a semiconductor device according to the first embodiment of the present invention.
Figure 2:
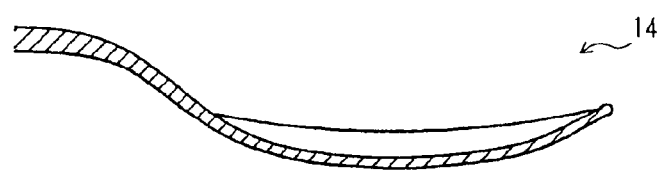
FIG. 2 is a sectional view of a spoon-shaped nozzle used in the development apparatus according to the first embodiment of present invention.
Figure 3:
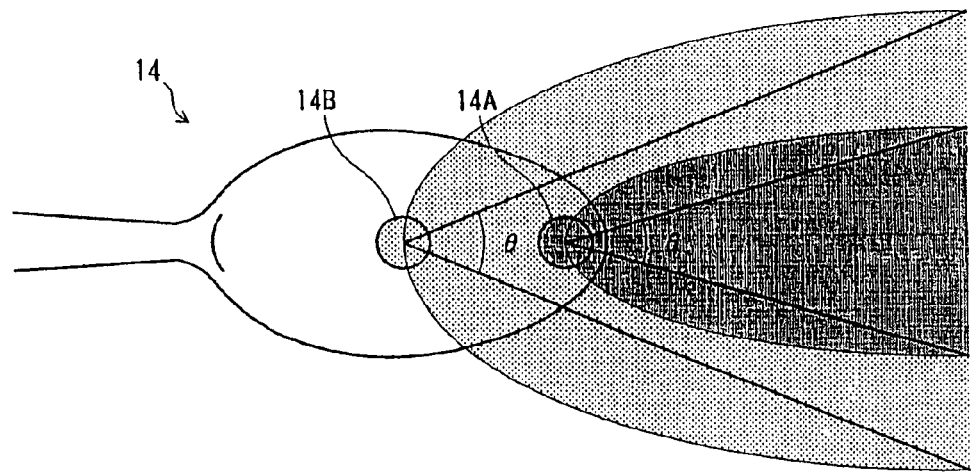
FIG. 3 is top plan view of the spoon-shaped nozzle of FIG. 2 showing the spray angle of a developer discharged by a nozzle pipe.

In FIGS. 1–4, reference numeral 11 denotes a developer tank, 12 an electromagnetic valve, 13 a nozzle pipe, 14 a spoon-shaped nozzle having a taper (hereinafter "nozzle"), 14A a top portion of the nozzle 14, 14B a middle portion of the nozzle 14, θ an spray angle of the developer, and 15 a substrate (wafer).

The spray angle θ (extension of the sprayed area) of the developer is varied with the position of the spoon-shaped nozzle 14, to which the developer is discharged by the nozzle pipe 13. That is, the spray angle θ is large where the width of the spoon shape is large and small where the width is small. For example, in FIG. 3, when the developer is discharged from the nozzle pipe 13 to the top portion 14A of the nozzle 14, the spray angle θ is small, and when the developer is discharged to the middle portion 14B of the nozzle 14, the spray angle θ is large.

Thus, according to the present invention, the spoon-shaped nozzle 14 is capable of not only forming a widely spread coating at a low pressure but also changing the spray angle θ only by changing the position of discharge of the developer under a constant pressure. An actual pressure is determined based upon various factors, such as the size of the nozzle pipe, the size of the spoon-shaped nozzle, the diameter of the substrate, the distance between the substrate and the spoon-shaped nozzle, and the flow amount of the developer. However, it may be as low as approximately 1.0 kg/cm² or below.

Figure 4:
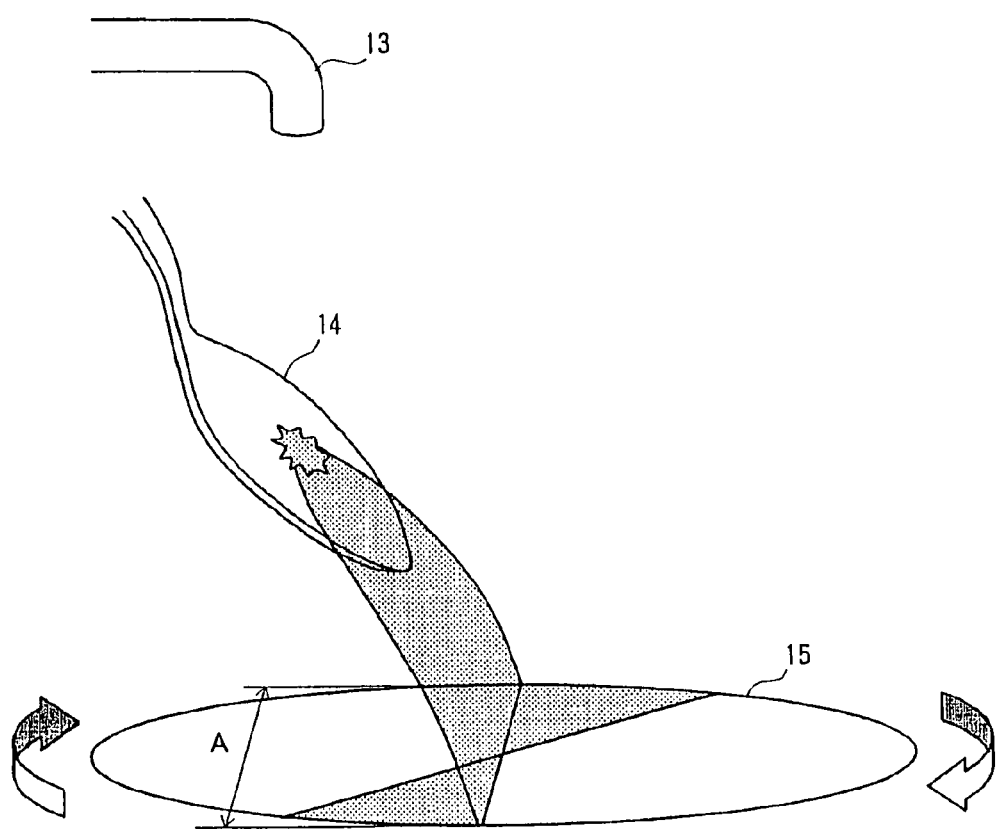
FIG. 4 is a schematic diagram showing application of the developer using the spoon-shaped nozzle according to the first embodiment of the present invention.

In this embodiment, the discharge position of the developer is determined such that the sprayed developer covers the largest width of the substrate 15, and the substrate 15 is rotated for the developer coating. That is, as shown in FIG. 4, the substrate 15 is rotated with the nozzle pipe 13 and the nozzle 14 fixed at the same positions. The positions of the nozzle pipe 13 and the nozzle 14 are predetermined such that a width A of the sprayed developer becomes equal to the diameter of the substrate 15.

As described above, according to the first embodiment, it is possible to provide a widely spread coating at a constant pressure without changing the discharge pressure and the nozzle.

Figure 5:
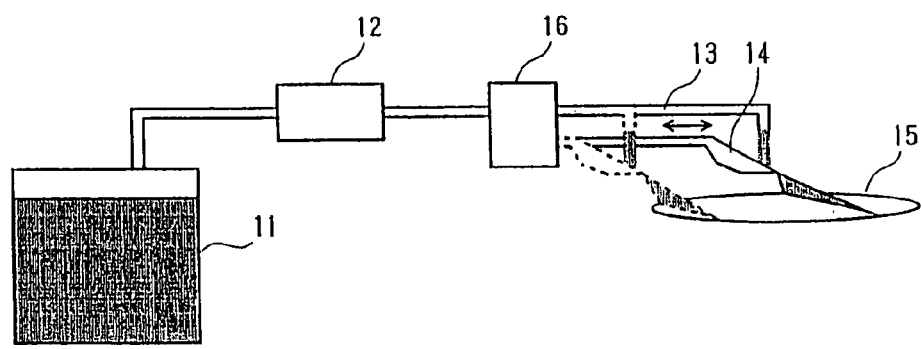
FIG. 5 is a schematic diagram of a development apparatus for manufacturing a semiconductor device according to the second embodiment of the present invention.

In FIG. 5, reference numeral 16 denotes a nozzle adjustment mechanism. In the second embodiment, the positions of the nozzle pipe and the nozzle are adjusted by the nozzle adjustment mechanism 16 with the substrate fixed without any rotation.

Figure 6:
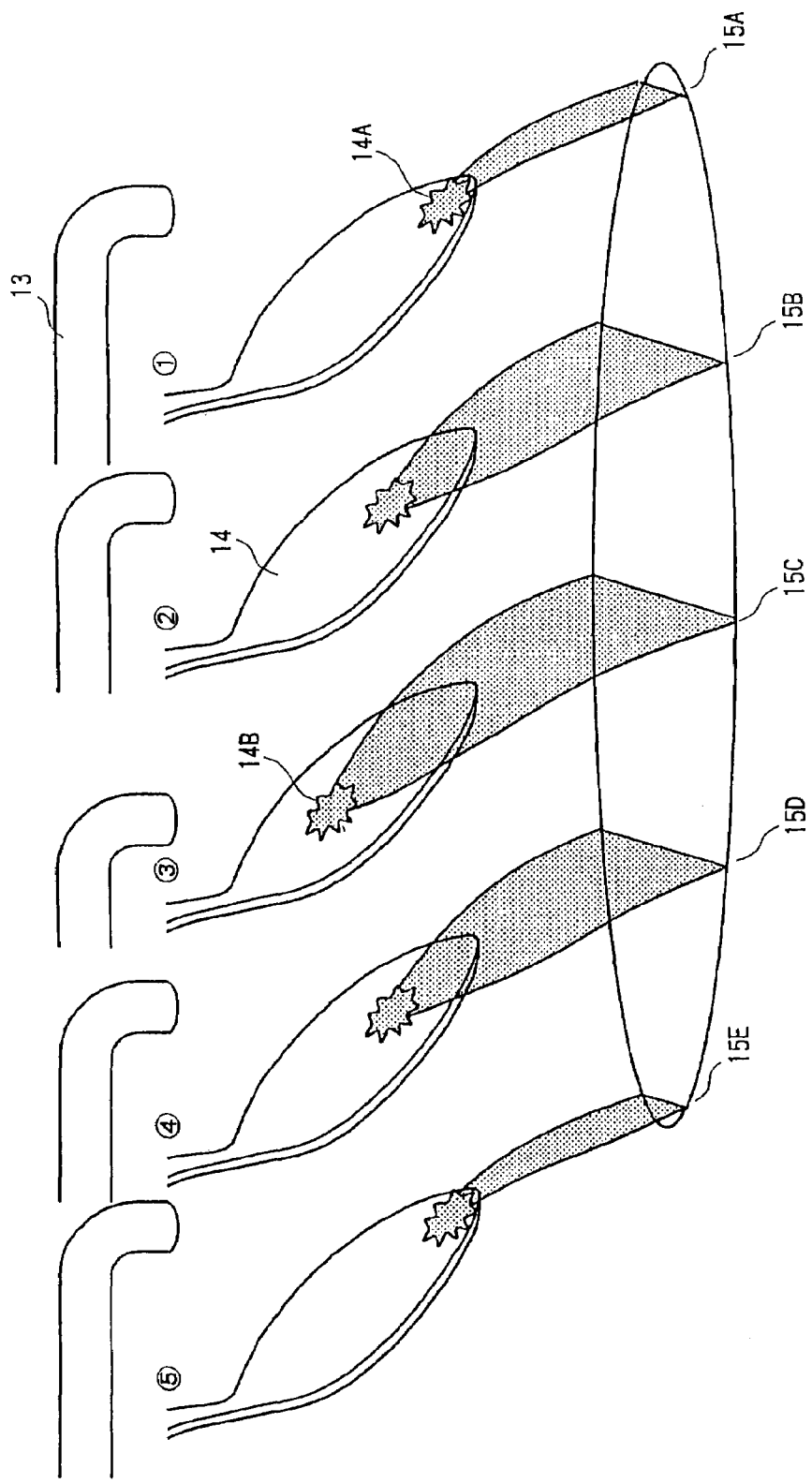
FIG. 6 is a schematic diagram showing application of the developer using the spoon-shaped nozzle according to the second embodiment of the present invention.

In FIG. 6, reference number 15A denotes a first position (right-hand position) of the substrate 15, 15B a second position (quarter position) of the substrate 15, 15C a third position (half position) of, 15D a fourth position (three-quarter position), and 15E a fifth position (left-hand position). That is, the nozzle 14 is slid from a position ① to a position ⑤ for coating the substrate 15. At this point, the developer discharge position to the nozzle 14 is adjusted by sliding the nozzle pipe 13 such that the width A of the sprayed developer becomes equal to the width of each sprayed position of the substrate 15.

For example, when the substrate 15 is coated from the first position 15A to the third position 15C, the nozzle 14 is moved from the position ① to the position ③ and the nozzle pipe 13 is scanned in a horizontal direction (X-axis direction) such that the developer is discharged from the top portion 14A (the spray angle θ is small) of the nozzle 14 to the middle portion 14B (the spray angle θ is large) of the nozzle 14. The nozzle 14 may be scanned instead of the scan of the nozzle pipe 13. In this embodiment, the substrate 15 is not rotated during the coating so that the waste of developer is minimized.

Figure 7A:
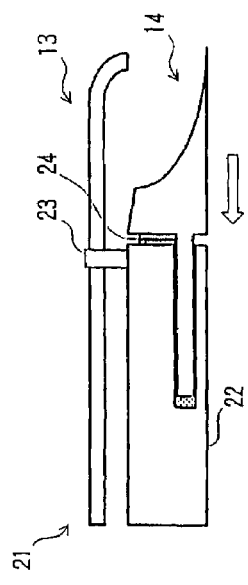
FIGS. 7(a) and 7(b) are side and top views a schematic diagram of a scanning mechanism made by a nozzle pipe and the spoon-shaped nozzle according to the second embodiment of the present invention, showing the first half of a scanning operation.
Figure 7B:
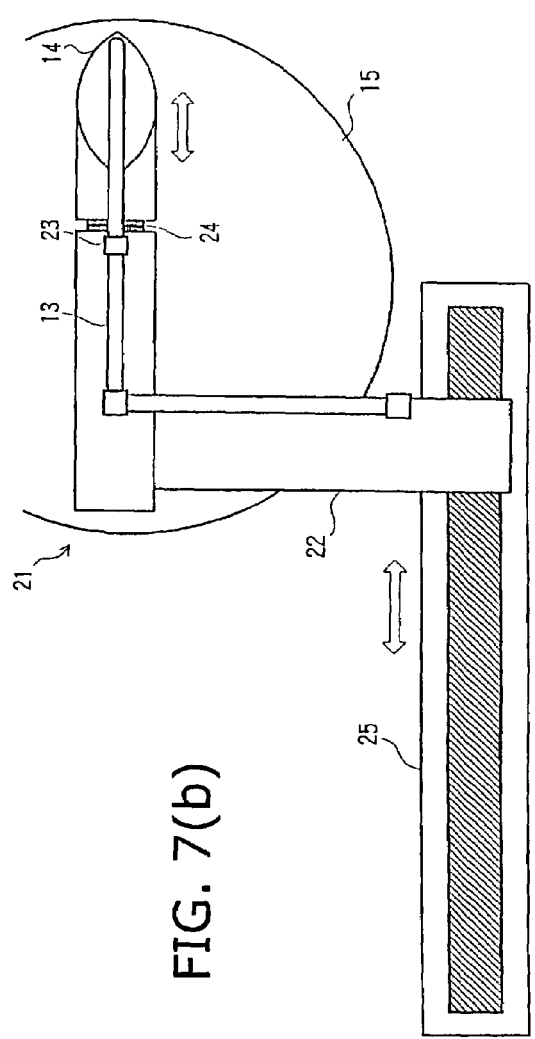
Figure 8A:
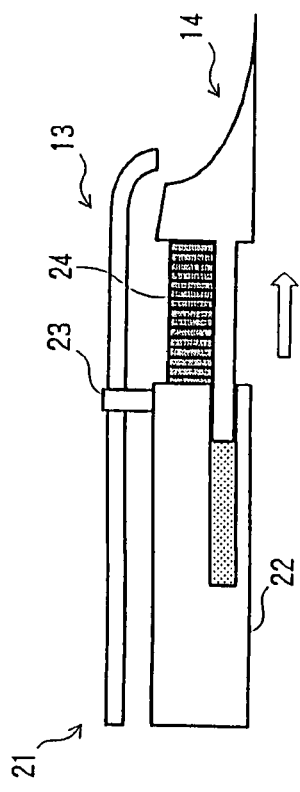
FIGS. 8(a) and 8(b) are side and top views of the scanning mechanism by the nozzle pipe and the spoon-shaped nozzle according to the second embodiment of the present invention, showing the second half of the scanning operation.
Figure 8B:
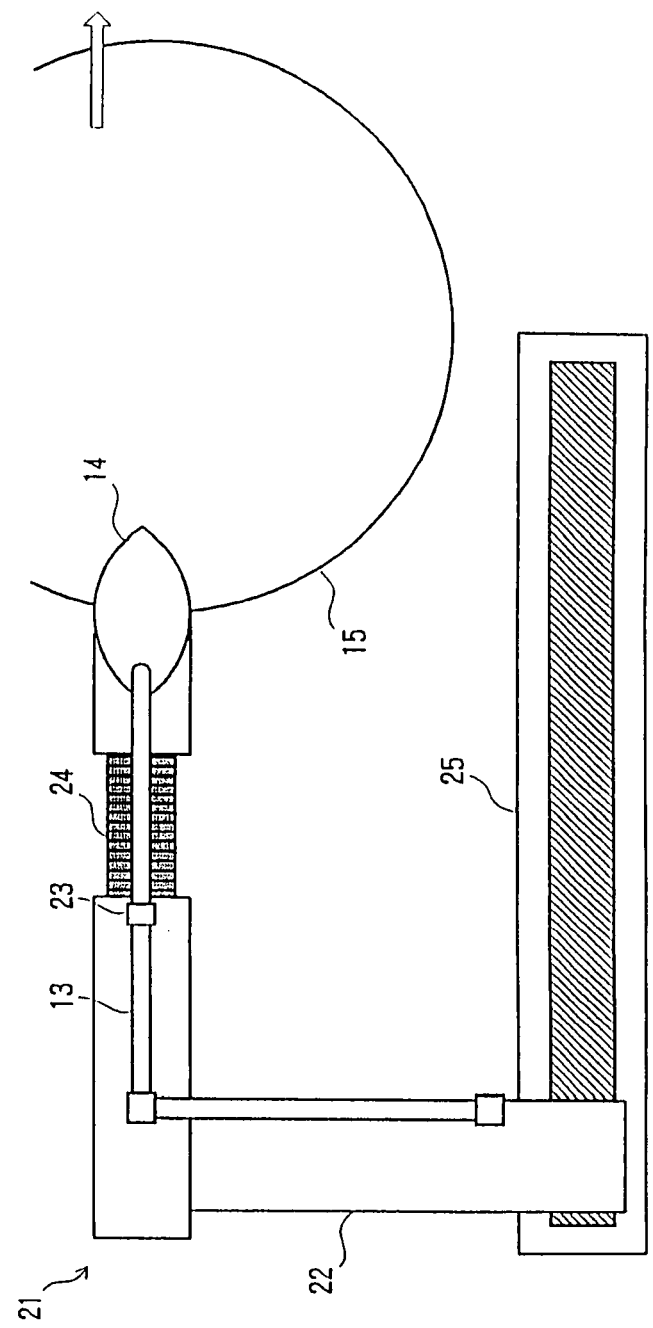
Figure 9:
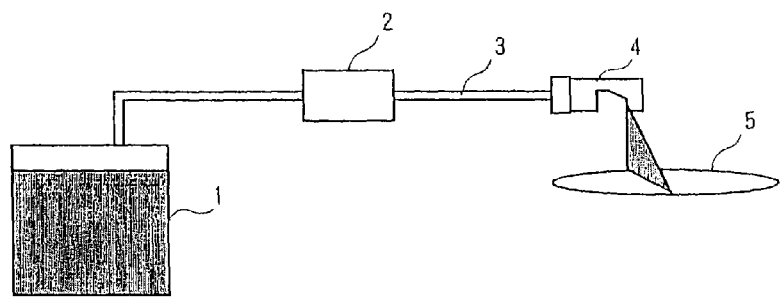
FIG. 9 is a schematic diagram of a conventional development apparatus for manufacturing a semiconductor device.

In FIGS. 7–8, reference numeral 21 denotes a nozzle block which integrates the nozzle pipe 13 and the nozzle 14, 22 a nozzle block body, 23 a fixture to fixing the nozzle pipe 13 to the nozzle block body 22, 24 an adjusting mechanism (for example, a piezoelectric expansion device) for the nozzle 14, and 25 a scanning mechanism (for example, a linear motor) for the nozzle block 21.

The position of the nozzle 14 with respect to the nozzle pipe 13 is adjusted by the adjusting mechanism 24 such that the discharge position of the developer supplied by the nozzle pipe 13 onto the nozzle 14 moves from the top portion 14A through the middle portion 14B to the top portion 14A again.

The position of the nozzle block 21 is varied by the driving mechanism 25 so that the application of the developer onto the stationary substrate 15 is smoothly performed.

According to the second embodiment, the nozzle pipe 13 and the nozzle 14 are simultaneously scanned by the scanning mechanism so that the stationary substrate 15 is efficiently coated with the developer with the minimum waste.

The present invention is not limited to the above preferred embodiments and a number of variations are possible without departing from the scope and spirit of the present invention. Accordingly, those variations should not be excluded from the scope of the present invention.

As fully described above, the present invention achieves the following effects.

(A) It is possible to provide a widely spread coating at a constant pressure without changing the discharge pressure and the nozzle.

(B) It is possible that the stationary substrate is efficiently coated with the developer with the minimum waste.

The invention claimed is:

1. A development apparatus for manufacturing a semiconductor device, said development apparatus discharging a developer onto a surface of a semiconductor substrate and comprising:

a nozzle pipe for supplying said developer; and a nozzle having a shape of a spoon with a taper and discharging said developer supplied by said nozzle pipe onto said surface of said substrate, wherein said nozzle sprays said developer onto said surface of said substrate at any spray angle under a low and constant pressure.

2. A development apparatus for manufacturing a semiconductor device, said development apparatus discharging a developer onto a surface of a semiconductor substrate and comprising:

a nozzle pipe for supplying said developer;

a nozzle having a shape of a spoon with a taper and discharging said developer supplied by said nozzle pipe onto said surface of said substrate; and a scanning device for simultaneously scanning said nozzle pipe and said nozzle above said substrate in a stationary state, wherein said nozzle sprays said developer onto said surface of said substrate at any spray angle under a low and constant pressure.

3. The development apparatus according to claim 2, which further comprises an adjusting device for adjusting a position of said nozzle with respect to a position of said nozzle pipe.

4. The development apparatus according to claim 3, wherein said adjusting device moves said nozzle with respect to said nozzle pipe.

5. The development apparatus according to claim 3, wherein said adjusting device moves said nozzle pipe with respect to said nozzle.

* * * * *